US006872422B2

(12) United States Patent
Gupta et al.

(10) Patent No.: US 6,872,422 B2
(45) Date of Patent: Mar. 29, 2005

(54) PROCESS FOR IMPARTING AND ENHANCEMENT OF COLOURS IN GEMSTONE MINERALS AND GEMSTONE MINERALS OBTAINED THEREBY

(76) Inventors: Samir Gupta, 76 Dhuleshwar Gardens, Jaipur, Rajasthan (IN), 302001; Manuj Goyal, 76 Dhuleshwar Gardens, Jaipur, Rajasthan (IN), 302001

( * ) Notice: Subject to any disclaimer, the term of this patent is extended or adjusted under 35 U.S.C. 154(b) by 380 days.

(21) Appl. No.: 10/055,613

(22) Filed: Jan. 25, 2002

(65) Prior Publication Data

US 2003/0008077 A1 Jan. 9, 2003

(30) Foreign Application Priority Data

Jul. 9, 2001 (IN) .................................................. 753/01

(51) Int. Cl.$^7$ .......................... C23C 16/00; C30B 29/10
(52) U.S. Cl. ........................... 427/255.25; 427/255.31; 427/255.7; 427/383.3; 501/86
(58) Field of Search ............................ 427/250, 255.28, 427/255.31–255.37, 255.7, 397.7, 377, 383.3; 501/86; 63/32

(56) References Cited

U.S. PATENT DOCUMENTS

| 3,897,529 | A |   | 7/1975  | Carr et al.    |
|-----------|---|---|---------|----------------|
| 3,950,596 | A |   | 4/1976  | Carr et al.    |
| 5,477,055 | A |   | 12/1995 | Skold et al.   |
| 5,853,826 | A | * | 12/1998 | Starcke et al. |
| 6,025,060 | A |   | 2/2000  | Meissner       |
| 2002/0128145 | A1 | * | 9/2002 | Pollak       |

FOREIGN PATENT DOCUMENTS

WO 98/48944 * 11/1998

OTHER PUBLICATIONS

Gems: Their Sources, Descriptions, and Identification R. Webster, 5$^{th}$ Edition, pp. 154–155, 165, 404–405.*
PatentAbstracts of Japan, vol. 003, No. 109 (C–058), Sep. 12, 1979, & JP 54 089999.
Patent Abstracts of Japan, vol. 009, No. 273, (P–401), Oct. 30, 1985 & JP 60 119506 A.
Patent Abstracts of Japan, vol. 011, No. 008 (C–396), Jan. 9, 19087 & JP 61 186294 A.
Patent Abstracts of Japan, vol. 011, No. 008 (C–396), Jan. 9, 1987 & JP 61 186293 A.
Patent Abstracts of Japan, vol. 011, No. 008 (C–396), Jan. 9, 1987 & JP 61 186295 A.
Kane et al., "The Identification of Blue Diffusion–Treated Sapphires," Gems & Gemology (Summer 1990), pp. 115–133.
McClure et al., "Update on Diffusion–Treated Corundum: Red and Other Colors," Gems & Gemology (Spring 1993), pp. 16–27.

* cited by examiner

Primary Examiner—Fred J. Parker
(74) Attorney, Agent, or Firm—Nixon & Vanderhye PC

(57) ABSTRACT

The present invention provides a process for imparting colors to colorless gemstone/minerals and enhancing properties of gemstone/minerals by coating a thin/thick film of a particular material or multiple films of different materials on polished gemstones/minerals to impart color in colorless stones and to enhance the color in paler stones, and to such gemstones/mineral obtained by the process.

28 Claims, No Drawings

PROCESS FOR IMPARTING AND ENHANCEMENT OF COLOURS IN GEMSTONE MINERALS AND GEMSTONE MINERALS OBTAINED THEREBY

FIELD OF THE INVENTION

The present invention relates to a process for imparting and enhancing colors in gemstone minerals and to gemstone minerals obtained thereby. In particular the present invention relates to a process for imparting colors to colorless gemstones and enhancing color of paler gemstones and to colored gemstones manufactured thereby. Even more particularly, the present invention relates to an environmentally friendly process for inducing colors and for enhancing the properties of gemstone minerals and to novel colored gemstones obtained thereby.

BACKGROUND OF THE INVENTION

In the field of personal adornment, colored stones have assumed great significance to the extent that demand today far surpasses supply. In view of the expense and costs involved in obtaining colored gemstones, a search is on for alternatives to colored stones. A vast range of colored as well as colorless minerals used as gemstones are being mined all over the world. The stones so obtained are cut and polished to make them suitable for a specific use. Such precious and semi-precious gemstones are extensively used in jewelry, decorative articles and ornaments. As demand of colored stones is huge compared to their natural availability, colorless and low colored natural gemstones are subjected to variety of treatments to enhance their properties like color, luster or transparency.

Certain colored stones and crystals have been sought and prized for their beauty beginning with ancient civilizations and continuing into the modem age, even to the extent of ascribing to them magical powers. Through appropriate cutting and polishing, the value and natural beauty of a precious stone may be further enhanced. While a vivid color is not always a requirement for a jewel, i.e., cut stone, it is an important attribute of red ruby, blue sapphire or green emerald. Furthermore, the color or lack thereof may be an important attribute of relatively clear gems, such as diamonds.

Besides its visual beauty, a gemstone for ornamental purposes has to possess a certain amount of durability to be classified as precious, since it should be displayable by the owner without fear of deterioration or tarnish. Gemstones of the requisite hardness to qualify as durable include gem varieties derived from conundrum (e.g., ruby, and sapphire) and from carbon (e.g., diamond). Such gemstones typically not only outlast their wearers but also sparkle with undiminished luster long after their metal setting has been abraded or eroded.

Finally, naturally occurring gemstones generally are of higher inherent value than artificially grown gems, regardless of the fact that artificial stones often are of purer color and higher internal crystal quality. Although this result is probably attributable to the lack of rarity in the artificial stone, some minor flaws in naturally occurring stones are thought to add beauty and character to the final jewel.

Naturally occurring gemstones may exhibit undesirable color zones in which the color is distributed unevenly in the gem. The uneven color zones generally make it more difficult for the lapidary to select the direction in which the gem should be advantageously cut. On the other hand, colorless crystals often are less attractive than colored ones.

Various attempts have been made to produce jewelry items of inexpensive materials with the appearance of expensive materials. For example, U.S. Pat. No. 1,005,564 describes a technique of employing colored sheets of celluloid to form various shapes to represent various natural materials and gems, such as coral, turquoise and the like. U.S. Pat. No. 4,295,347 describes other techniques employing lacquers on a substrate in order to simulate the appearance of a gem. U.S. Pat. No. 4,835,023 describes the use of various coatings on cultured pearls in order to improve the quality of the pearls. However, to date, the techniques employed to process an inexpensive material to give the appearance of an expensive material have been cumbersome, and, in some cases, have not achieved the desired result.

U.S. Pat. No. 6,146,723 discloses an enhanced gemstone and a method of simulating the appearance of an expensive gemstone. In the process of this invention, a clear crystalline faceted substrate is provided with a coating of colored transparent ink in order to enhance the appearance of the otherwise inexpensive gemstone. The ink is permanent type ink made from n-propanol, n-butanol and diacetone alcohol, which is soluble in a solution having isopropyl alcohol 99% strength. Once the coating has been applied to a substrate such as a cubic zirconia to enhance the appearance of the gemstone, the coating is removed by use of the solvent.

U.S. Pat. No. 5,853,826 discloses a method for the improvement in the color of transparent materials including gemstones. A faceted gemstone having at least one thin layer of material is coated on the pavilion of a transparent substrate so that the body of the gemstone appears to have a different color. The color of reflected light changes hues when viewed through the face of the gemstone at different angles of observation. This causes the gemstone to appear to change color when the stone is tilted. The thin film is coated by low temperature techniques such as sputtering.

A number of processes have been developed to improve the appearance of gemstones or to create simulated gemstones. Diffusion of ions into gemstones, such as titanium and/or iron into sapphire to give a blue color has been disclosed. This process is limited to specific ions and specific substrates. This process requires extremely high temperatures, which frequently damages the substrates. Diffusion processes cause the added ions to become part of the crystal surface with no distinct boundary and usually form a gradient of ion concentration in the base substrate. Examples of diffusion processes include U.S. Pat. Nos. 2,690,630 and 4,039,726.

TAVELITE™ is a product produced by depositing thin multiple layers on a transparent substrate to produce an interference effect. The process utilizes high temperatures and frequently results in substantial breakage of the product.

AQUA-AURA™, a product of Vision Industries is a surface treatment providing a single, moderately saturated, color. This process is proprietary but is reported to be a coating based upon gold and the use of high temperatures.

Nuclear radiation has been used to produce color centers in gemstones, giving a body color that can sometimes be improved with heat treatment. Cyclotrons and neutron bombardment are routinely used to impart blue color to colorless topaz.

Rhinestones and Carnival Glass have reflective coatings layered on one or more surfaces of a clear substrate. The coating is usually silver or some other highly reflective material utilized to apply a mirror coating (usually silver or aluminum) onto the pavilion (back) of a faceted glass gem.

In such a coating, all light is reflected without passing through the coating. Atmospheric pressure chemical vapor deposition has been used to deposit films of titanium oxide by the thermal decomposition of a titanium compound (usually $TiCl_4$) in air.

Layered coatings on a surface of gemstones have been done to increase the "fire" of the stone. These techniques involve the coating of a highly refractive material, with respect to the gemstone's index of refraction, followed by a second coating of a different highly refractive material. The layers are designed so that the reflected light at each interface of each layer causes an optical interference effect. An example of such a method is U.S. Pat. No. 3,490,250.

U.S. Pat. No. 5,084,909 describes color enhancement brought about in natural and synthetic gem materials by high-energy gamma ray fields for extended periods of time (50 to 1000 hours). High-energy radiation fields are necessary for this process. It is extremely interesting to note that disclosed in this reference the inventor utilized heat to bleach or remove unwanted colors from the gems (either before or after a well-known color enhancement procedure that involved electron bombardment). Therefore, this reference clearly teaches that heat has been utilized not to enhance color but to lessen color intensity in at least gem-type materials.

U.S. Pat. No. 5,477,055 presents a thorough review of the history of coloring precious or semi-precious gemstones via single or combined radiation treatments. The color enhancement process related is a two step method that includes fast neutron irradiation at between 350° C. to 600° C. followed by gamma ray or electron bombardment. Higher temperatures tend to fragment the gemstones. The elevated temperatures (above room temperature) tend to reduce unwanted side (blue-gray) colors.

U.S. Pat. No. 4,749,869 discloses a process for irradiating topaz and the product resulting therefrom. A three-step method of color enhancement is described in which a sample stone is: 1) exposed to high energy neutrons; 2) exposed to electrons; and 3) heated to between 250° F. (121° C.) and 900° F. (482° C.). The heating step tends to "bleach-out" or remove unwanted side colors, thereby enhancing the desired blue color.

U.S. Pat. No. 2,945,793 discloses a method for heat treatment of diamonds to increase desirable coloration. Irradiation by electrons in followed by heating to about 500° C. to again, decrease undesirable tints within the diamond. However, this invention relates specifically only to reducing the color of diamonds in order to enhance the clarity and transparency.

U.S. Pat. No. 6,025,060 discloses a method and apparatus for creating unique gemstones. The method comprises the steps of optically contacting the gemstones of interest followed by a heat treatment of the composite gemstone. The heat treatment step increases the bond strength and therefore the resistance of the bond to reversal. In one aspect of the invention, a composite gem is fabricated by bonding a naturally occurring gem to an artificial gem to form a single composite gemstone of large size that outwardly appears to be a single natural gem. The composite gem may be fabricated at a fraction of the cost of a natural stone of the same size. In another aspect of the invention, an intensely colored natural stone is bonded to a colorless or lightly colored artificial stone. This composite retains the intense color associated with the natural stone while enjoying the brilliance, depth, and size resulting from the combination of stones. In another aspect of the invention, various composite gemstones are fabricated using a variety of stones of both natural and artificial origin. The stones may be layered with two, three, or more layers. The composite gem may either take the form of a simple layered gem, or the composite gem may be in the form of a variety of three-dimensional shapes. In another aspect of the invention, the composite gem includes an engraved pattern at one or more internal gem interfaces. The engraving is completed prior to bonding the stones together and may convey either a two-dimensional or a three-dimensional image.

U.S. Pat. No. 4,039,726 discloses changing the color of conundrum by diffusing chromophores such as iron/titanium, chromium, chromium/nickel, or chromium/iron/titanium into natural or artificial crystals at temperatures typically above 1700° C.

In the last decade, a variety of techniques such as electron beam irradiation [U.S. Pat. No. 5,637,878, Herer, Arnold S., Knobel, Thomas M. and Robb, Gregory J., Jun. 10, 1997}, Cobalt-60 irradiation [U.S. Pat. No. 5,084,909, Pollak, January 1992] neutron bombardment [U.S. Pat. No. 4,749,869, Richard Fournier, June 1988], heat treatment, diffusion and the like, have been employed in the art to produce colors in colorless gems and/or enhance the properties of colored stones.

However, the hitherto known processes mentioned above suffer from significant drawbacks in term of cost, safety, efficacy and the like. In irradiation, a widely used commercial process, the stones are exposed to a beam of high-energy subatomic particles or electromagnetic radiation such as neutron or gamma rays either to enhance color or to produce a color in colorless stones. Commercially used radiation includes: high-speed negatively charged electrons from a linear accelerator; high-speed alpha particles (positively charged helium nuclei) from either a linear accelerator or a cyclotron; energetic neutrons from an atomic pile; and high energy gamma rays from a Cobalt-60 source. Charged particles induce color skin depth due to their small size while high-energy neutron and gamma irradiation color the whole stone. The dose and energy of the particle beam determine the quality and degree of color induction in gemstones. Subsequently, the irradiated samples are heat treated to stabilise the color. For example, diamond, zircon, topaz, quartz, conundrum, beryl etc. are subjected to irradiation for enhancing their color and appearance. [R. Webster, 'GEMS' Butterworths—Heinemann Ltd Oxford, London, 1994]. Heat treatment is an ancient method to enhance properties of most of the gemstones. Quartz, topaz, zircon, conundrum, ruby, sapphire, amethyst, citrine, aquamarine are examples of gemstones whose colors can be altered by heat treatment (Ted Themelis, "The heat treatment of Ruby and Sapphire" ISBN 0-9409-6510-0, Published by Gemlab. Inc., Typeergraphics Inc. USA] In recent years, diffusion technique has also been reported to produce color in gemstones. [J. I. Koivula, and R. C. Kammerling, Gems & Gemmology, Vol. 26, No. 1, PPI00-101]. In this method, the gemstones are heated in powder of a metal or a metallic compound at a high temperature to produce colors in them.

While irradiation has been established world over as a commercial technique to enhance and produce color gemstones, particularly for the manufacture of blue Topaz, this technique requires expensive and complex equipment i.e. accelerator to produce an energetic beam of particles. The cost and maintenance of an accelerator is very high. An established safety procedure has to be followed to operate the system and highly skilled operators are needed to run and maintain the equipment. Further, safety demands cooling of the radiated samples as treated stones emit hazardous radiation. Therefore, the irradiated gemstones require storage in a specially designed container for a period of a few weeks to a few months to kill the emission of hazardous radiation from the stones, before these are marketed. Even after this cooling, the samples may emit the reminiscent radiation [Crowningshield, Robert, 'Irradiated topaz and radioactivity', Gems and Gemology, 17, No. 4, 1984, pp 179–180].

Another disadvantage in the process of irradiating stones to enhance or impart color is that of permanency. The exposure of radiated stones to high temperature during use on occasion results in the loss of color. Additionally, irradiation technique is a multi-step process. The stones are first subjected to neutron or gamma radiation to induce color, and then subjected to electron exposure for color uniformity and then a heat treatment at a temperature between 150 to 1100° C. for a few hours to stabilize color [U.S. Pat. No. 5,637,878, Herer, Arnold S., Knobel, Thomas M. and Robb, Gregory J., Jun. 10, 1997}, U.S. Pat. No. 5,084,909, Pollak, January 1992, U.S. Pat. No. 4,749,869, Richard Fournier, June 1988], The disadvantage of heat treatment processes known in the art is that color is induced only in some specific minerals. One group of such minerals is called idiochromatic minerals, which contain one of the transition elements as its constituent. The second group of gemstones is allochromatic gems, which are colored due to the presence of small quantities of various transition elements as impurities [K. Nassau, 'Physics and Chemistry of color' Wiley—Interscience Publication, John Wiley & Sons, N.Y, 1983]. The third group owes their hue to a color centre, which is a defect in a crystal, which is able to trap an electron [K., Nassau, 'The origin of color in minerals and gems.' Lapidary J. In 3 parts: 29: 920–28, 1060–70, 1250–58, and 1521, 1975]. Therefore, the yield of treatment may not be cost effective unless all stones belong to one of the above categories.

Colouring of minerals by diffusion is achieved through heating the stones with a color—causing compound in powder form. The elements from the powder diffuse into the surface of the stones to induce color in the surface. This powder-based diffusion generally damages the surface resulting in low yield.

Recently, a two-step process has been developed to improve the yield [U.S. Pat. No. 5,888,918, Pollak, Richard, March 1999]. In this process, initially the stones in combination with a treating agent in powder form are heated together followed again by a high temperature treatment at a temperature in the range of 900° up to about 1250° C. for a time in the range of about 3 up to 200 hours in the absence of the treating agent to produce desired color. The use of two separate temperature cycles will result in low yield and is therefore not suitable for economical commercial production. Another disadvantage observed in this two-step treatment process is that uniformity in color is not readily achieved.

OBJECT OF THE INVENTION

The main objective of the present invention is to provide an environment friendly process for imparting colors and enhancing properties of minerals useful as gemstones which obviates the drawbacks of the hitherto known processes enumerated above.

Another object is to provide a process to produce colored minerals wherein no hazardous chemicals are used to produce colored minerals.

Yet another object is to provide a process in which colored gemstones do not emit any hazardous radiation after the treatment.

Yet another object is to provide a process by which a range of colors and different shades can be produced in gemstones, and the process is reproducible.

Yet another object is to provide a process to produce colored gemstones which do not deteriorate or tarnish.

Yet another object is to provide a process, which requires only one heat treatment cycle to produce colors in minerals, and therefore minimizes breakage.

Yet another object of the invention is to provide a process by which multi-colored or bi-colored stones can be easily produced with different combinations and/or contrasting colors.

Yet another object of the invention is to provide a process by which colored gemstones can be produced which do not tarnish or deteriorate.

Yet another object is to provide a process to produce colored gemstones, which do not loose their colors even if subjected to high temperatures during setting in jewelry.

Yet another object is to provide a process to produce colored stones whose color hold very well up to routine wear, jewelry cleaning and repair procedure.

Yet another object is to provide a process, which does not need a complex system or a critical procedure.

Yet another object is to provide a process, which does not require highly skilled operators.

Yet another object is to provide a process, which produces highly uniform intensity color in gemstones, with excellent surface finish and requiring no chemical cleaning.

Yet another object is to provide a process, which offers an easy control on intensity of a color being produce in gemstones.

Yet another object is to provide a process, which does not produce physical damage in the stone surface.

Yet another object is to provide a process capable of mass production.

Yet another object is to provide a process, which is highly reproducible and economical for production.

SUMMARY OF THE INVENTION

In accordance with the present invention, there are provided processes for imparting colors to colorless gemstone/minerals and enhancing properties of gemstone/minerals, said processes comprising:

Coating of a film of varying thickness, of a particular material, or multiple films of different materials on polished gemstones/minerals to impart color in colorless stones and to enhance the color in paler stones.

A wide variety of minerals can be treated according to the present invention. Examples of suitable minerals (useful as gemstones) contemplated for uses herein include topaz, sapphire, and the like.

A variety of techniques can be employed in the practice of the present invention to coat a film of a desired material on the polished stones. Typically, physical vapour deposition, or chemical vapour deposition, or any other technique known in film technology and the like can be used for this purpose.

A wide variety of metals can be employed as a film material to deposit the film on mineral stones in the invention process. Examples of suitable metals include transition metals, as well as other metals, which can induce a color or modify the color of the mineral being treated.

A wide variety of metal oxides can also be employed to deposit films on the mineral stones in the invention process, optionally in further combination with a plurality of the metals set forth hereinabove. Examples of suitable metal oxides include transition metal oxides, as well as other metal oxides, which can impart or modify the color of the mineral being treated.

A variety of chemical compounds/alloys can also be employed as film materials to coat gemstones provided one of the constituents of the compound/alloy used contains at least one element capable of inducing color in the mineral.

Induced or enhanced colors which can be imparted by the invention process can be varied based on such variables as the particular gemstone being treated, the particular film material employed, the conditions to which the gemstones are subjected and the like. For example, if cobalt is one of the constituents of the film material then topaz can be colored to a dark blue to light blue color, or a light green to dark green color, or a light blue-green to dark blue-green color, or a light green-blue to a dark green-blue color depending on the concentration of cobalt in the composition of the film material or thickness of the film if only cobalt metal is used and the heat treatment conditions employed. Similarly, if the minerals are coated with iron or an iron containing compound/alloy then yellow to reddish yellow or pinkish yellow colored stones can be produced. Like wise, chromium or a chromium containing compounds/alloys produce green colored stones. Similarly, if two layers, first of cobalt and second film of chromium are deposited then commercially known colors like London, Baby, Swiss and Sky blue are obtained, which hitherto had been obtained only through electron/nuclear radiation techniques.

A wide range of cobalt containing compounds/alloys such as cobalt-nickel or, cobalt-nickel-zircon or cobalt-silicide or cobalt-oxide and the like can be employed as film materials to produce different shades of blue to green or their mixed colors in the stones as described above.

A wide range of metallic compounds/alloys containing elements capable of inducing colors in the stone being treated can be employed as the film material to produce different colored gem stones.

A wide range of treating conditions can be employed in the practice of the present invention. Typically, conditions suitable to impart or enhance the color of a gemstones comprise subjecting the film coated stones to a heat treatment to a temperature in the range of about 900° C. up to about 1200° C., for a time range of about 30 minutes up to about 10 hours. Normally, air is employed as environment during a heat treatment process Typically such heating is carried out at ambient pressure However, the gemstone can optionally be subjected to an inert or a reducing or an oxidising environment while being heat-treated. For inert environment, nitrogen or argon or helium gases and the like can be used while to provide oxidising ambient oxygen and the like and for reducing ambient forming gas (a mixture of nitrogen/hydrogen) and the like is employed. A particular gas is flown continuously during heat treatment to obtain the desired ambient. The heat treatment of coated stones can also be carried out in vacuum to employ a non-oxidising or a non-reducing environment. The ambient conditions significantly affect the color saturation, intensity and fire of the treated stones. Therefore, a suitable environment is employed during a heat treatment to color or to enhance the properties of gemstones.

Generally, longer exposure times and/or higher exposure temperatures lead to a greater intensity of color being imparted to the minerals being treated, as well as imparting the degree of color saturation achieved by the process. However, higher temperature may cause cracks in the stones if the untreated stones contain hidden defects in the crystals.

Thus employment of higher temperatures or excessively long exposure may affect the yield of the so produced colored stones. As readily known by the skill in the art, the particular ranges and exposure times will not only vary as a function of the intensity and/or level of desired color saturation, in addition, the ability of a given mineral to withstand such a temperature without suffering significant fracturing must also be considered. For example, topaz would not be typically subjected to conditions as rigorous as sapphire.

While gemstones can be used in the invention treating process without any special pre-treatment, it is presently desired that gemstones employed in the practice of the invention be cleaned prior to being processed to impart color or to enhance color thereof This pre-treatment is employed only to remove grease or dust particle or any foreign contaminant from the surface of the gemstones. Suitable cleaning methods are well known to those of skill in the art, and include washing in water, organic media, and the like.

Gemstones treated according to the present invention can also be used directly without any further treatment.

In accordance with another embodiment of the present invention, there are provided colored or color-enhanced gemstones having a color-imparting element/s either diffuse from the film/s material into the surface thereof or form a transparent colored film over the surface of the stone. The diffused atoms of the color imparting element/s penetrate in the crystal to became a part of its structure while atoms of color imparting elements which form a transparent film over the stone surface, get chemically bonded to the surface atoms of the crystal structure. Color imparting film materials contemplated include the materials described hereinabove.

In accordance with yet another embodiment of the present invention, there are provided colored/color-enhanced gemstones wherein at least the skin depth of the surface of the said stone has chemically bonded there to color-imparting elements in the film material.

The color-imparting film materials contemplated include the materials described hereinabove.

The invention will now be described in a greater detail with reference to the following non-limiting examples.

EXAMPLE 1

Cleaning Process:

Stones treated in accordance with the present invention are cleaned as follows. First, the polished stones are cleaned in boiling distilled water containing a small amount of detergent and then cleaned thoroughly in running distilled water and then cleaned thoroughly in organic solvents selected from trichlroethylene, acetone, and methanol to remove dust and oil from the surface thereof. The clean dry stones are now ready for deposition of a film-material.

EXAMPLE 2

Film Deposition:

Clean dry stones are coated with thin/thick film of an appropriate material. Any one of conventional techniques known in thick/thin film technology like physical vapour deposition, or chemical vapour deposition, and the like can be employed to coat a film of a desired material on the gemstones. For multi-layered process, the deposition of film of first material follows the deposition of second film and so on.

EXAMPLE 3
General Treatment Protocol:

To induce color in the gemstones, film coated samples are placed in a suitable vessel, which can withstand the heat treatment temperatures contemplated for use. A ceramic crucible, or a plate and the like can be used. The vessel is then placed in a furnace capable of attaining and accurately maintaining temperatures in the range of about 900° up to about 1200° C. The desired gas is flown into the furnace to obtain the desired environment and the furnace is then heated to the desired temperature and maintained at that temperature for the desired length of time. Once the desired time and temperature requirements, to obtain the desired color are satisfied, the furnace is cooled down and the vessel containing the gemstones is removed.

EXAMPLE 4
Treatment of Topaz:

Topaz is coated with a film of cobalt or a cobalt containing material to achieve a variety of colors. Heat treatments of these stones in a temperature range of 1000° C. to 1100° C. in air for a time in the range of 30 minutes to 5 hours induces light blue to dark blue color in the stones. When these stones are heated in a temperature range of 900° C. to 1000° C. in air for a time in the range of 30 minutes to 3 hours light green to dark green color is induced in the stones. To obtain mixed colored green-blue or blue green topaz, the stones are heated in a temperature range of 950° C. to 1050° C. for an appropriate exposure time. If the process is carried out in nitrogen or a reducing gas, ambient intensity and shades of blue color in stones can be varied. Similarly, the use of oxidising environment during heat treatment alters the intensity and shades of green stones.

The coating of cobalt thin film followed by chromium film on topaz and heating the stones in air at 1080° C. for 3 hours induces commercially known colors such a London, Baby, Swiss and Sky blue (otherwise obtainable only by electron/nuclear radiation techniques) in the stones.

To produce colors from yellow to orange and orange-red, a film of iron containing material is coated on the gem stone and heat treatment is carried out in air or oxygen in the temperature range of 700 to 900° C. for 30 min. to 3 hours.

To produce imperial colors similar to that of naturally occurring imperial topaz, with colors ranging from imperial to reddish imperial, a film of iron material, followed by chromium and nickel is coated on to the gem stone and heat treatment carried out in air or oxygen at a temperature in the range of 700 to 900° C. for 30 minutes to 3 hours.

To produce bi-colored topaz stones, firstly, a portion of the stone is masked and the remaining unmasked portion of the stone is coated with a film of the desired color inducing/enhancing material. The masking is then removed from the first portion, and another masking applied to the already coated portion. The unmasked uncoated portion is then coated with a different color enhancing/inducing material in the form or a film. The mask is then removed and the stone heated using appropriate heat treatment cycle to induce the desired colors. Multi colored stones can be produced by increasing the number of masks used.

EXAMPLE 5
Treatment of Sapphire:

Sapphire is subjected to the same process as described in Example 4. Care should be taken in selecting the temperature to which the stones are heated to avoid damage. The color production in sapphire is like that in topaz i.e. dark blue to light blue, or dark green to light green or a mixed ones depending on the time and temperature cycle employed for the treatment.

While the invention has been described in detail with reference to certain preferred embodiments thereof, it will be understood that modifications and variations are within the spirit and scope of that which is described and claimed.

The Main Advantages of the Technique of the Present Invention Are

1. The color induced/enhanced in the gem stone is highly uniform since the film of colouring agent is atomically deposited on the stone surface and is uniform in thickness throughout the surface of the stone.
2. Only one heat cycle is involved to induce color in stones. So the heat generated cracks or fractures in gemstones are minimised in the present process.
3. Different shades of the same color or mixtures of colors can be obtained by manoeuvring the thickness and/or composition of thin film and/or heating cycle.
4. Post treatment in terms of cleaning of the gem stones is not required since the invention uses a film coating technique, whereby excess colouring agent present on the stone surface is avoided and all the deposited material is incorporated into the stone.
5. There is no damage to the stone surface since the colouring agent is deposited uniformly and atomically onto the stone surface.
6. Bi-colored and multi-colored stones can be obtained by judicious selection of colouring materials.
7. The process is eco-friendly as no any hazardous chemical is used in the process.
8. The process is eco-friendly, as treated gemstones do not emit any kind of radiation.
9. The process employs conventional thin/thick film technology based technique to coat film material on the stones. Therefore, the involved equipment is not at all a complex system and can be operated by any trained person.
10. An important advantage of the present invention from commercial point of view is that the colored gemstones produced by this process can immediately be marketed, as no radiation cooling is required in the present process.
11. The process produces highly uniform color all over the surface of the gemstones.
12. The durability and stability of the treated stones against ultra sonic, steam cleaning, boiling in a detergent, heat and chemicals involved in jewelry repair, electroplating and low temperature shock is extremely good.
13. Different shades of same color or mixture of colors can easily be produced just by manipulating the heating conditions.
14. The technique is applicable to almost all stones for colouring provided an appropriate combination of material and heating cycle is chosen. In principle, the process can produce all possible colors in most of the available gemstone minerals provided an appropriate color inducing film-material is used to coat the minerals and appropriate conditions are employed for heat treatment.

We claim:

1. A process for imparting color to a gemstone, the process comprising coating the gemstone with one or more color inducing/enhancing materials in the form of a thin film and subjecting the coated gemstone to heat treatment at a temperature in the range of about 700° C. up to about 1200° C. for a time in the range of about 30 minutes to about 10 hours in air or an oxidizing atmosphere to obtain a colored gemstone.

2. A process as claimed in claim 1 wherein the gemstone is selected from topaz and sapphire.

3. A process as claimed in claim 1 wherein the gemstone is cleaned before coating.

4. A process as claimed in claim 1 wherein two or more color inducing/enhancing materials are coated on to the gemstone in the form of films at discrete portions on the gemstone prior to the heat treatment and the coated gemstone then subjected to heat treatment to obtain colored gemstones with two or more discrete colors imparted thereto.

5. A process as claimed in claim 4 wherein the said two or more color inducing/enhancing films are of varying thickness sepending on the intensity of color induction/enhancement desired in the gemstone.

6. A process as claimed in claim 1 wherein the color inducing/enhancing material is incorporated into the crystal lattice of the substrate.

7. A process as claimed in claim 1 wherein the color inducing/enhancing material is chemically bonded onto the surface of the substrate.

8. A process as claimed in claim 1 wherein the color inducing/enhancing material is selected from the group consisting of metal, a metal oxide, a metallic compound, and an alloy.

9. A process as claimed in claim 8 wherein the metal or metal oxide is a transition metal or a transition metal oxide respectively.

10. A process as claimed in claim 8 wherein the metal is selected from the group consisting of cobalt, cobalt containing material, iron, iron containing material, chromium, chromium containing material, and any mixture thereof.

11. A process as claimed in claim 8 wherein the metal oxide is selected from cobalt oxide and iron oxide.

12. A process as claimed in claim 10 wherein the cobalt containing material is selected from the group consisting of cobalt-chromium and cobalt oxide-chromium oxide.

13. A process as claimed in claim 10 wherein the iron containing material is selected from the group consisting of iron-nickel-chromium and iron oxide-nickel oxide-chromium oxide.

14. A process as claimed in claim 4 wherein the color inducing/enhancing material film is selected from chromium or chromium oxide film.

15. A process as claimed in claim 1 wherein the color inducing/enhancing is coated onto the gemstone in the form of multiple films of different metals or alloys at discrete and separate portions of the gemstone.

16. A process as claimed in claim 15 wherein one metal film coated on the gemstone is cobalt and another film is of chromium.

17. A process as claimed in claim 15 wherein one metal film coated on the gemstone is iron and another film is of chromium-nickel.

18. A process as claimed in claim 16 wherein the gemstone comprises topaz, the coated topaz being heated at a temperature of 1080° C. in air for 3 hours to induce London, Baby, Swiss and Sky blue colors.

19. A process as claimed in claim 1 wherein the gemstone comprises topaz, the topaz being coated with a film of a cobalt or a cobalt containing material and being heated at a temperature in the range of 1000 to 1100° C. in the presence of air for a time in the range of 30 minutes to 5 hours to induce light blue to dark blue color.

20. A process as claimed in claim 1 wherein the gemstone comprises topaz, the topaz being coated with a film of a cobalt or a cobalt containing material and being heated at a temperature in the range of 900 to 1000° C. in of air or an oxidising gas for a time in the range of 30 minutes to 3 hours to obtain light green to dark green color.

21. A process as claimed in claim 1 wherein the gemstone comprises topaz, the topaz being coated with a film of a cobalt or a cobalt containing material and being heated at a temperature in the range of 950 to 1050° C. in air to induce green-blue or blue-green color in the topaz.

22. A process as claimed in claim 1 wherein the gemstone comprises topaz and a film of iron containing material is coated thereon and heat treatment is carried out in air or oxidising gas at a temperature in the range of 700 to 900° C. for 30 min. to 3 hours to obtain colors from yellow to orange and reddish-orange.

23. A process as claimed in claim 1 wherein the gemstone comprises topaz and a film of iron material is coated on one portion thereof, followed by chromium and nickel film at another portion of the gemstone and heat treatment is carried out in air or oxidising has at a temperature in the range of 700 to 900° C. for 30 min. to 3 hours to obtain colors from imperial to reddish imperial.

24. A process as claimed in claim 1 wherein the gemstone comprises topaz and is heated at a temperature in the range of 700° C. to 900° C. in air or an oxidising gas for a time in the range of 30 minutes to 3 hours to induce yellow to orange and orange-red colors.

25. A process and claimed in claim 8 wherein the gemstone is topaz, and is coated with films of different color inducing/enhancing materials to obtain bi-colored or multi-colored gemstones.

26. A process as claimed in claim 1 wherein the gemstone comprises sapphire and the color obtained ranges from dark blue to light blue, or dark green to light green or a mixture thereof depending on the time and temperature cycle employed for the treatment.

27. A process as claimed in claim 4 wherein the color inducing/enhancing film is coated onto the gemstone by physical vapour deposition and/or chemical vapour deposition.

28. A process as claimed in claim 1 wherein the gemstone is cleaned to remove dust, grease or any other foreign contaminant adhering to the gemstone surface.

* * * * *

(12) EX PARTE REEXAMINATION CERTIFICATE (6832nd)
United States Patent
Gupta et al.

(10) Number: US 6,872,422 C1
(45) Certificate Issued: May 19, 2009

(54) PROCESS FOR IMPARTING AND ENHANCEMENT OF COLOURS IN GEMSTONE MINERALS AND GEMSTONE MINERALS OBTAINED THEREBY

(76) Inventors: Samir Gupta, 76 Dhuleshwar Gardens, Jaipur, Rajasthan (IN), 302001; Manuj Goyal, 76 Dhuleshwar Gardens, Jaipur, Rajasthan (IN), 302001

Reexamination Request:
No. 90/008,432, Feb. 26, 2007

Reexamination Certificate for:
Patent No.: 6,872,422
Issued: Mar. 29, 2005
Appl. No.: 10/055,613
Filed: Jan. 25, 2002

(30) Foreign Application Priority Data

Jul. 9, 2001 (IN) .................................................. 753/01

(51) Int. Cl.
*C04B 41/045* (2006.01)
*C04B 41/052* (2006.01)
*C04B 41/051* (2006.01)
*C30B 33/00* (2006.01)

(52) U.S. Cl. .............................. 427/255.25; 427/255.31; 427/255.7; 427/383.3; 501/86

(58) Field of Classification Search ........................ None
See application file for complete search history.

(56) References Cited

U.S. PATENT DOCUMENTS

| | | |
|---|---|---|
| 5,853,826 A | 12/1998 | Starcke et al. |
| 5,888,918 A | 3/1999 | Pollak |
| 6,376,031 B1 | 4/2002 | Pollak |
| 6,635,309 B2 | 10/2003 | Pollak |

*Primary Examiner*—Jerry D. Johnson

(57) ABSTRACT

The present invention provides a process for imparting colors to colorless gemstone/minerals and enhancing properties of gemstone/minerals by coating a thin/thick film of a particular material or multiple films of different materials on polished gemstone/minerals to impart color in colorless stones and to enhance the color in paler stones, and to such gemstones/mineral obtained by the process.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–28 is confirmed.

* * * * *